US008097498B2

(12) United States Patent
Purayath et al.

(10) Patent No.: US 8,097,498 B2
(45) Date of Patent: Jan. 17, 2012

(54) DAMASCENE METHOD OF MAKING A NONVOLATILE MEMORY DEVICE

(75) Inventors: Vinod Robert Purayath, Santa Clara, CA (US); George Matamis, San Jose, CA (US); James Kai, Santa Clara, CA (US); Takashi Orimoto, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 161 days.

(21) Appl. No.: 12/693,322

(22) Filed: Jan. 25, 2010

(65) Prior Publication Data
US 2011/0183475 A1    Jul. 28, 2011

(51) Int. Cl.
*H01L 21/20* (2006.01)
(52) U.S. Cl. .... 438/129; 438/128; 438/238; 257/E21.09
(58) Field of Classification Search .................. 438/128, 438/129, 238
See application file for complete search history.

(56) References Cited

U.S. PATENT DOCUMENTS

| 6,015,738 | A | 1/2000 | Levy et al. |
|---|---|---|---|
| 2005/0052915 | A1 | 3/2005 | Herner et al. |
| 2005/0073010 | A1 | 4/2005 | Lai et al. |
| 2006/0246606 | A1 | 11/2006 | Hsu et al. |
| 2006/0292301 | A1 | 12/2006 | Herner |
| 2007/0072360 | A1 | 3/2007 | Kumar et al. |
| 2008/0254576 | A1 | 10/2008 | Hsia et al. |
| 2009/0179310 | A1 | 7/2009 | Dunton et al. |

FOREIGN PATENT DOCUMENTS

WO    2009/091786 A1    7/2009

OTHER PUBLICATIONS

U.S. Appl. No. 11/015,824, filed Dec. 17, 2004, Hemer et al.
U.S. Appl. No. 11/819,078, filed Jul. 25, 2007, Hemer et al.
U.S. Appl. No. 12/007,780, filed Jan. 15, 2008, Hemer et al.
U.S. Appl. No. 12/216,924, filed Jul. 11, 2008, Ping et al.
International Searching Authority: European Patent Office (ISA/EP). International Search Report and Written Opinion, PCT Application PCT/US2011/022400. Apr. 8, 2011.

*Primary Examiner* — Alexander Ghyka
(74) *Attorney, Agent, or Firm* — The Marbury Law Group, PLLC

(57) ABSTRACT

A method of making a device includes providing a first device level containing first semiconductor rails separated by first insulating features, forming a sacrificial layer over the first device level, patterning the sacrificial layer and the first semiconductor rails in the first device level to form a plurality of second rails extending in a second direction, wherein the plurality of second rails extend at least partially into the first device level and are separated from each other by rail shaped openings which extend at least partially into the first device level, forming second insulating features between the plurality of second rails, removing the sacrificial layer, and forming second semiconductor rails between the second insulating features in a second device level over the first device level. The first semiconductor rails extend in a first direction. The second semiconductor rails extend in the second direction different from the first direction.

13 Claims, 11 Drawing Sheets

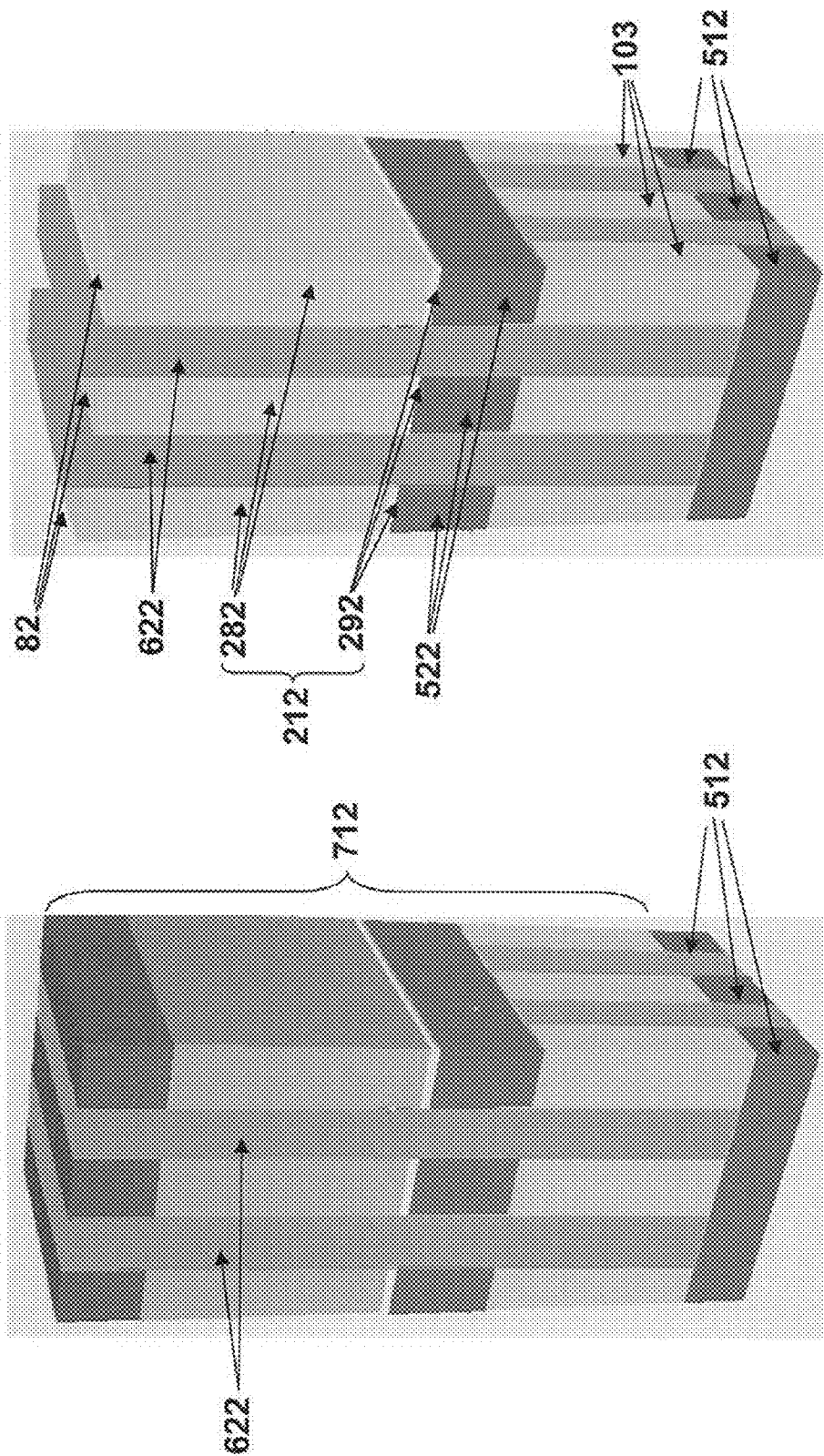

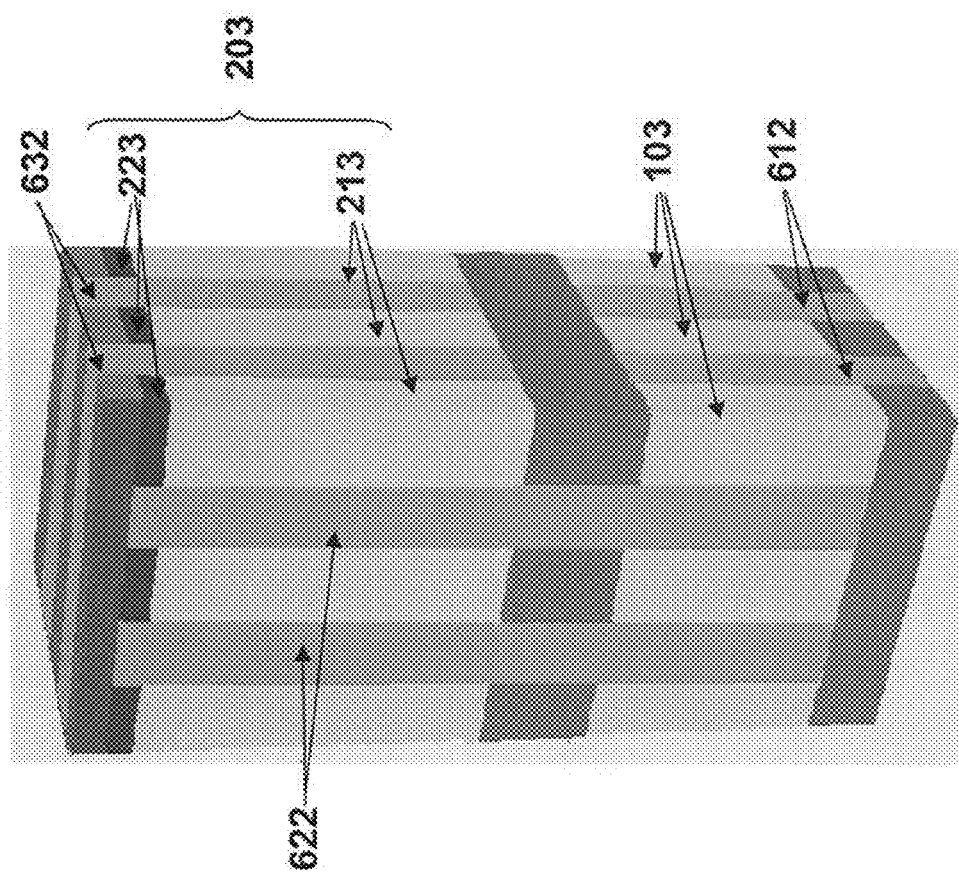

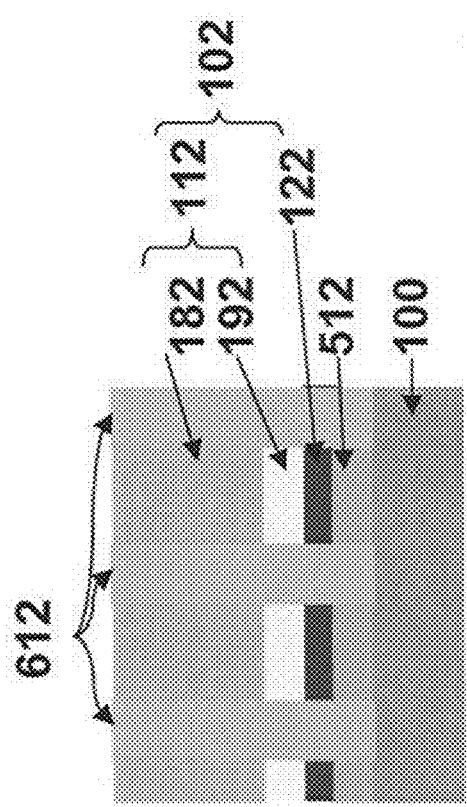
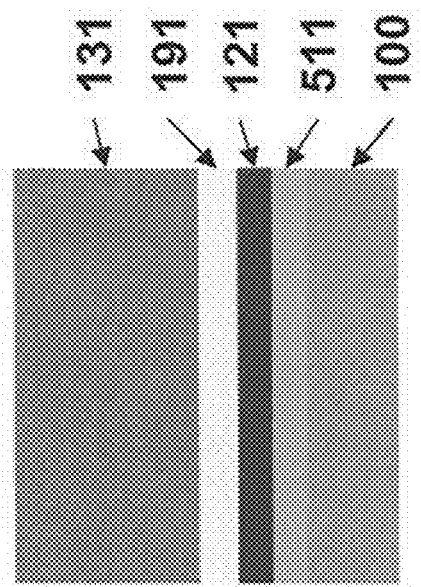

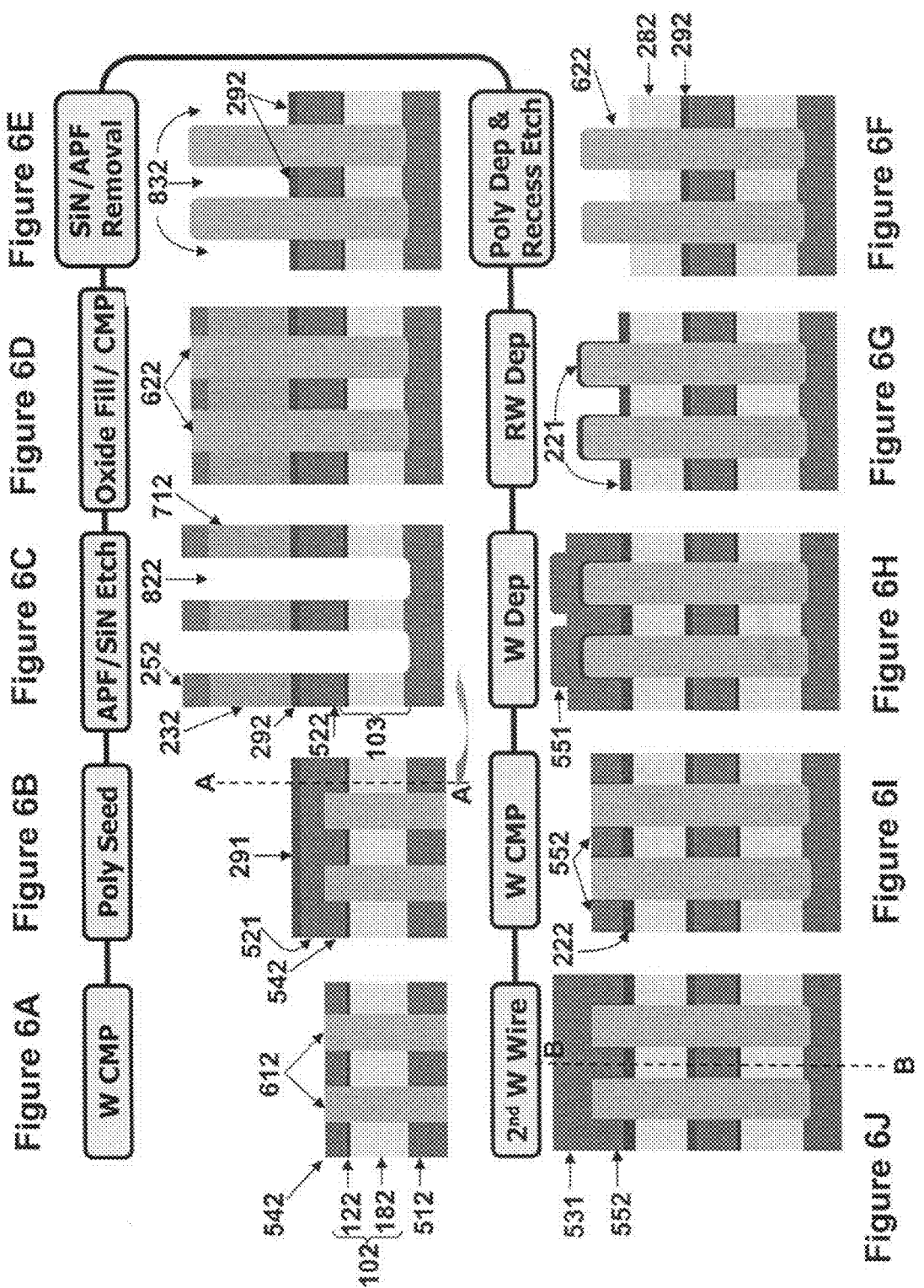

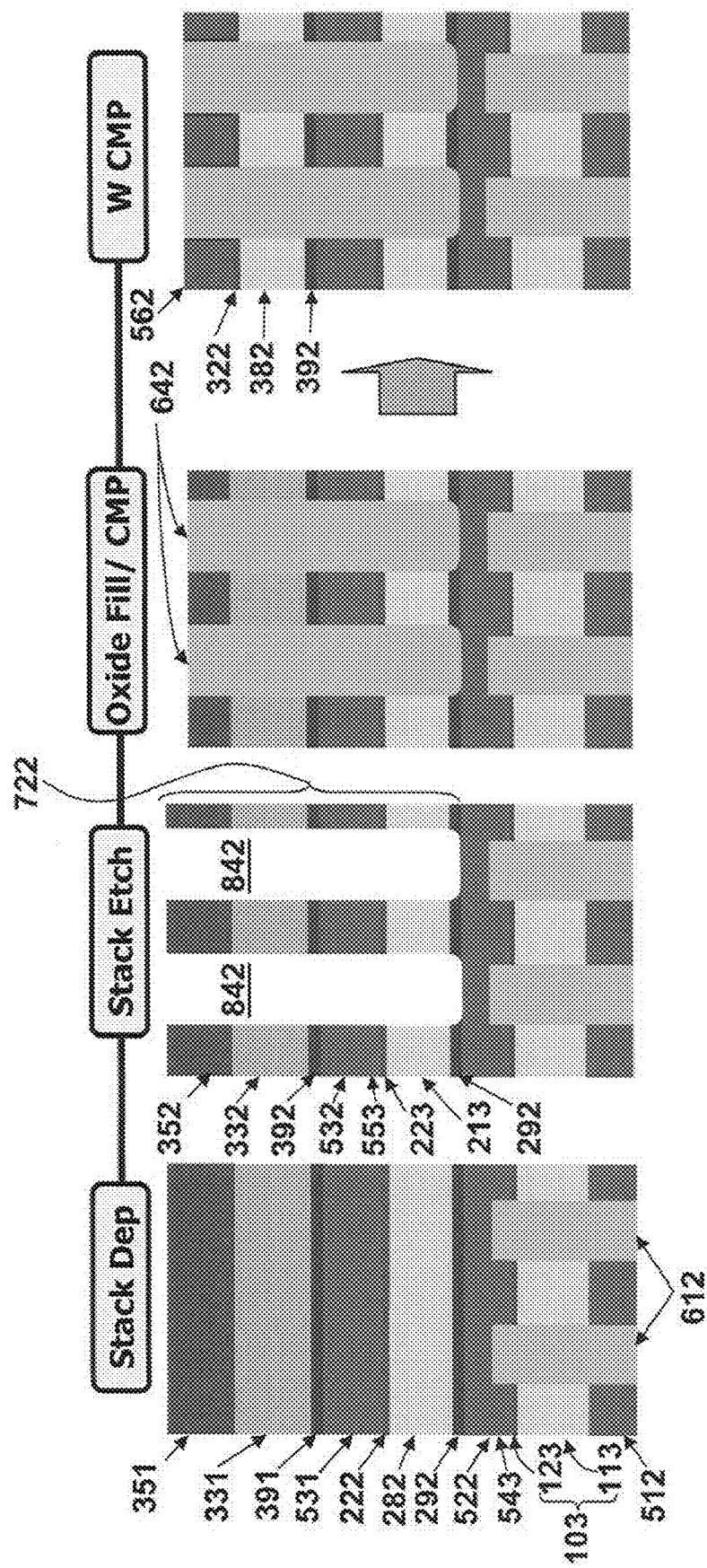

DAMASCENE METHOD OF MAKING A NONVOLATILE MEMORY DEVICE

FIELD OF THE INVENTION

The present invention relates generally to the field of semiconductor device processing, and specifically to methods of making non-volatile memory devices.

BACKGROUND

Herner et al., U.S. patent application Ser. No. 10/955,549 filed Sep. 29, 2004 (which corresponds to US Published Application 2005/0052915 A 1), hereby incorporated by reference, describes a three dimensional memory array in which the data state of a memory cell is stored in the resistivity state of the polycrystalline semiconductor material of a pillar shaped semiconductor junction diode. A subtractive method is used to fabricate such pillar diode devices. This method includes depositing one or more silicon, germanium or other semiconductor material layers. The deposited semiconductor layer or layers are then etched to obtain semiconductor pillars. A $SiO_2$ layer can be used as a hard mask for the pillar etching and removed afterwards. Next, $SiO_2$ or other gap fill dielectric material is deposited in between and on top of the pillars. A chemical mechanical polishing (CMP) or etchback step is then conducted to planarize the gap fill dielectric with the upper surface of the pillars.

For additional description of the subtractive pillar fabrication process, see Herner et al., U.S. patent application Ser. No. 11/015,824, "Nonvolatile Memory Cell Comprising a Reduced Height Vertical Diode," filed Dec. 17, 2004 and U.S. patent application Ser. No. 11/819,078 filed Jul. 25, 2007. However, in the subtractive method, the height of the semiconductor pillar may be limited by thin and soft photoresist used as the etching mask. The photoresist mask material etches at a slower rate than the semiconductor material, but etches nonetheless, and some mask material must remain when the semiconductor etch is completed. The oxide gap filling step after pillar etch presents a processing challenge when the aspect ratios of the openings between the pillars increases and/or the CMP process or etchback of the gap fill layer removes a significant thickness of the deposited semiconductor material. Further, the performance of semiconductor pillar may be significantly degraded when exposed to long-time etching steps.

SUMMARY

One embodiment of the invention provides a method of making a device including providing a first device level comprising first semiconductor rails separated by first insulating features, the first semiconductor rails extending in a first direction, forming a sacrificial layer over the first device level, patterning the sacrificial layer and the first semiconductor rails in the first device level to form a plurality of second rails extending in a second direction, wherein the plurality of second rails extend at least partially into the first device level and are separated from each other by rail shaped openings which extend at least partially into the first device level, forming second insulating features between the plurality of second rails, removing the sacrificial layer, and forming second semiconductor rails extending in the second direction between the second insulating features in a second device level over the first device level.

Another embodiment of the invention provides a method of making a device including forming a plurality of sacrificial material rails and first conductive rails located below the sacrificial material rails extending in a first direction, forming first insulating features between the plurality of sacrificial material rails, removing the sacrificial material rails, and forming semiconductor rails over the first conductive rails between the first insulating features.

Another embodiment of the invention provides a method of making a device comprising forming a first seed layer over first conductive rails, forming a first sacrificial layer over the first seed layer, patterning the first sacrificial layer and the first seed layer to form a plurality of first rails extending in a first direction, forming first insulating features between the plurality of first rails, removing the first sacrificial layer to expose the patterned first seed layer, forming first semiconductor rails over the patterned first seed layer exposed between the first insulating features to form a first device level comprising first semiconductor rails separated by insulating material of first insulating features, the first semiconductor rails extending in the first direction, forming second conductive rails over the first semiconductor rails, forming a second seed layer over the second conductive rails, forming a second sacrificial layer over the second seed layer, patterning the second sacrificial layer, the second seed layer, the second conductive rails and the first semiconductor rails in the first device level to form a plurality of second rails extending in a second direction, wherein the plurality of second rails extend at least partially into the first device level and are separated from each other by rail shaped openings which extend at least partially into the first device level, forming second insulating features between the plurality of second rails resulting in a structure comprising first pillar-shaped non-volatile memory cells separated by insulating material of the first and second insulating features, removing the second sacrificial layer to expose the second seed layer, forming second semiconductor rails over the second seed layer exposed between the second insulating features, patterning the second semiconductor rails and the second insulating features located between the second semiconductor rails to form a plurality of third rails extending in the first direction, and forming third insulating features between the plurality of third rails resulting in a structure comprising second pillar-shaped non-volatile memory cells separated by insulating material of the second and third insulating features.

BRIEF DESCRIPTION OF THE DRAWINGS

FIGS. 1a to 1g are three dimensional ("3D") schematic drawings illustrating stages in formation of a device having at least two device levels according to one embodiment.

FIGS. 4a to 4b are side cross-sectional views illustrating stages in formation of the first device level according to an alternative embodiment.

FIGS. 6a to 6j are side cross-sectional views illustrating stages in formation of the first and second device levels according to an alternative embodiment.

FIGS. 7a to 7d are side cross-sectional views illustrating stages in formation of the second and third device levels according to an alternative embodiment.

DETAILED DESCRIPTION OF THE PREFERRED EMBODIMENTS

Figures 1A, 1B:
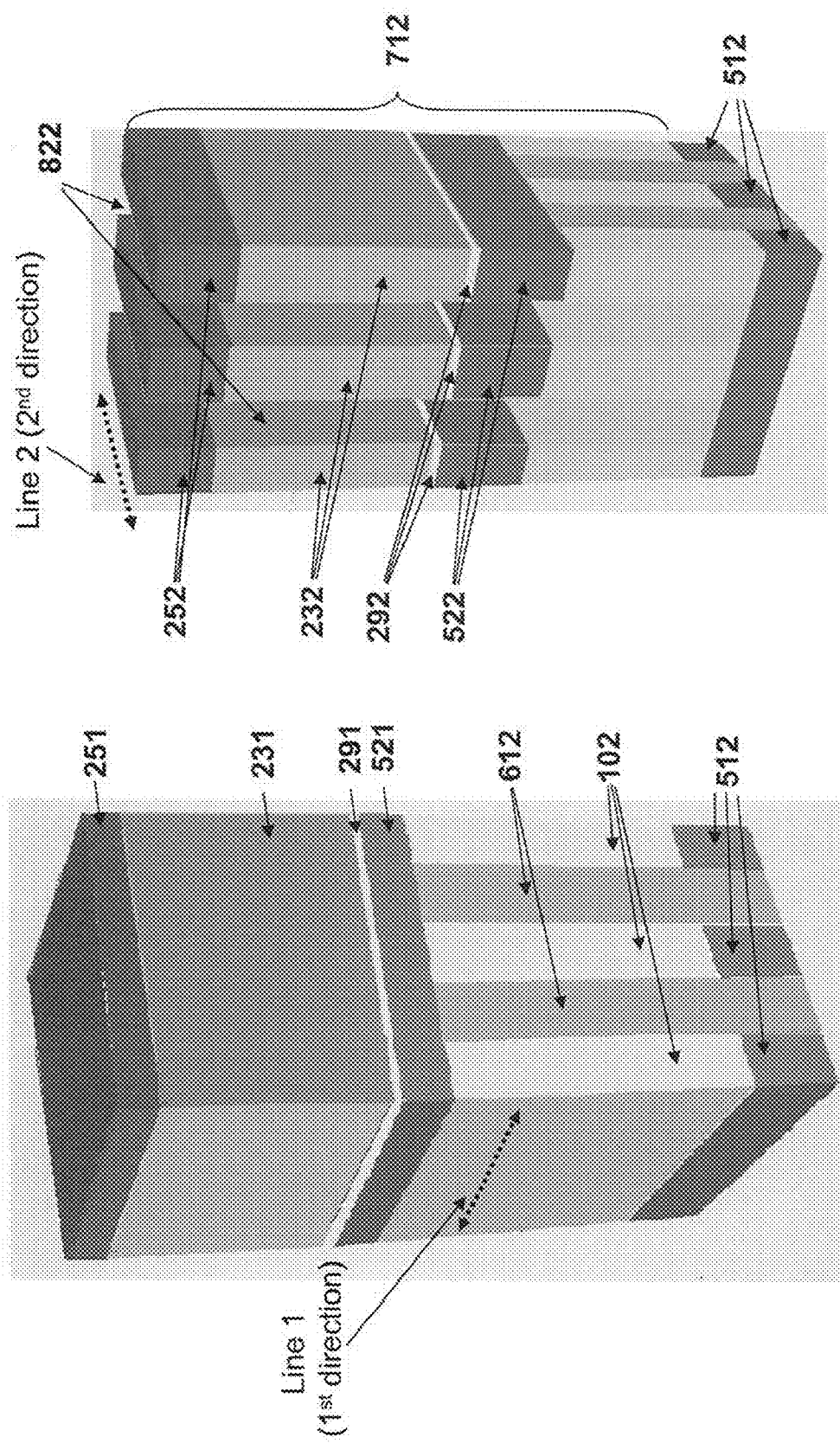

The below described methods may be used to form any suitable device. In one embodiment, they can be used to form a monolithic, three dimensional non-volatile memory array, in which multiple memory levels are formed above a single substrate, such as a semiconductor wafer, with no intervening substrates. The non-volatile memory cells may share a conducting wire or electrode between two adjacent device levels. In this configuration, the "bottom" diode will "point" in the opposite direction of the diode in the "upper" layer (i.e., the same conductivity type layer of each diode electrically contacts the same wire or electrode located between the diodes). With this configuration, the two cells can share the wire between them and still not have a read or write disturb issue. Alternatively, an interlevel dielectric can be formed above the first memory level, its surface planarized, and construction of a second memory level begins on this planarized interlevel dielectric, with no shared electrodes.

One embodiment of the invention provides a method of making a device, comprising providing a first device level comprising first semiconductor rails separated by first insulating features, forming a sacrificial layer over the first device level, patterning the sacrificial layer and the first semiconductor rails in the first device level to form a plurality of second rails extending in a second direction, wherein the plurality of second rails extend at least partially into the first device level and are separated from each other by rail shaped openings which extend at least partially into the first device level, forming second insulating features between the plurality of second rails, removing the sacrificial layer, and forming second semiconductor rails between the second insulating features in a second device level over the first device level. The first semiconductor rails extend in a first direction, while the second semiconductor rails extending in the second direction different from the first direction. Preferably, the second direction is substantially perpendicular to the first direction.

In some embodiments, the first device level may further comprise a first switching material located above or below the first semiconductor rails. The step of forming second insulating features between the plurality of second rails forms first pillar-shaped non-volatile memory cells separated by insulating material of the first and second insulating features in the first device level.

The method may further comprise patterning the second semiconductor rails and the second insulating features located between the second semiconductor rails to form a plurality of third rails extending in the first direction, and forming third insulating features between the plurality of third rails to form second pillar-shaped non-volatile memory cells separated by insulating material of the second and third insulating features. The first device level may comprise first conductive rails extending in first direction located below first semiconductor rails, and second conductive rails extending in the second direction located above the semiconductor rails. In some embodiments, the method may further comprise forming third conductive rails extending in the first direction over the second pillar-shaped non-volatile memory cells.

In some embodiments, each of the second pillar-shaped non-volatile memory cells comprises a diode and a switching material located above or below the diode. To form switching material above the diode, the method may further comprise recessing the second semiconductor rails to form rail shaped openings after forming the second semiconductor rails between the second insulating features, and forming the switching material in the rail shaped openings over the second semiconductor rails. In another embodiment, the step of forming the second semiconductor rails comprises selectively depositing the second semiconductor rails between the second insulating features on a semiconductor seed layer over the first device level below a height of the second insulating features to form rail shaped openings over the second semiconductor rails. The switching material can then be formed in the rail shaped openings over the second semiconductor rails. To form the switching material below the diode, the switching material rails may be formed between second conductive rails and the sacrificial material rails. In these embodiments, the second semiconductor rails can then be formed over the switching material rails by either selective or non-selective deposition methods.

In some embodiments, the first device level may be also formed by a damascene method. In these embodiments, the method of forming the first device level may comprise forming a plurality of first sacrificial material rails and first conductive rails located below the first sacrificial material rails extending in a first direction, forming first insulating features between the plurality of first sacrificial material rails, removing the first sacrificial material rails, and forming first semiconductor rails over the first conductive rails between the first insulating features. Of course, the first device level may be formed by any other suitable method, for example, by forming a stack of device layers, patterning the stack of device layers to form rails, and forming insulating material between the rails.

In another embodiment, prior to the steps of forming the second device level, semiconductor pillars separated by insulating material may be formed by patterning the first semiconductor rails and the first insulating features located between the first semiconductor rails to form a plurality of second rails extending in a second direction, and forming second insulating features between the plurality of second rails. Each of the semiconductor pillars may comprise a pillar diode. Second conductive rails extending in the second direction may be formed over the first semiconductor pillars.

In some embodiments, the first switching material may be formed below the diode. In these embodiments, the first switching material rails may be formed between first conductive rails and first sacrificial material rails. The first semiconductor rails, the first switching material rails, and the first insulating features located between the first semiconductor rails can then be patterned to form a plurality of second rails extending in a second direction, followed by forming second insulating features between the plurality of second rails resulting in a structure comprising first pillar-shaped non-volatile memory cells separated by insulating material of the first and second insulating features. Second conductive rails extending in the second direction can also be formed over the pillar-shaped non-volatile memory cells.

In some other embodiments, the first switching material may be formed above the diode, by recessing the first semiconductor rails to form rail shaped openings between the first insulating features, forming first switching material rails in the rail shaped openings over the first semiconductor rails, patterning the first switching material rails, the first semiconductor rails and the first insulating features to form a plurality of second rails extending in a second direction, and forming second insulating features between the plurality of second rails resulting in a structure comprising first pillar-shaped non-volatile memory cells separated by insulating material of the first and second insulating features. Alternatively, the step of forming first semiconductor rails comprises selectively depositing the first semiconductor rails between the first insulating features on a first semiconductor seed layer over the first device level below a height of the first insulating features to form rail shaped openings over the first semiconductor rails. In these embodiments, the first switching material rails can then be formed in the rail shaped openings over the first semiconductor rails, followed by patterning the first switching material rails, the first semiconductor rails and the first insulating features to form a plurality of second rails extending in a second direction and forming second insulating features between the plurality of second rails.

FIGS. 1a through 1f show 3D schematic drawings illustrating stages in formation of a device of a first embodiment. FIGS. 6a through 6j show side cross sectional view illustrating stages in formation of a device of according alternative method of the first embodiment.

Referring to FIGS. 1a and 6a, a first device level includes first non-volatile memory rails 102 separated by first insulating features 612. The rails 102 extend in a first direction along Line 1. Rails 102 may include semiconductor rails located above or below switching material rails as will be described below with respect to FIGS. 3A-3F and 4A-4B. In some embodiments, the rails 102 are located over first conductive rails 512 which extend in the first direction.

A second conductive layer 521 can then be formed over the first device level, followed by forming a seed layer 291, such as a semiconductor seed layer, over the second conductive layer 521, a sacrificial layer 231 over the seed layer 291, and an optional hard mask layer 251 over the sacrificial layer 231.

In an alternative embodiment shown in FIGS. 6a and 6b, a conductive layer is formed over recesses over the rails 102 (each of which includes a semiconductor rail 182 and a switching material rail 122). The conductive layer is planarized by chemical mechanical polishing, etc., to form conductive rails 542 over the switching material rails 122 between insulating features 612. If desired, a switching material layer and the conductive layer can be planarized in the same step to form the switching material rails 122 and the conductive rails 542 in the same planarization (e.g., polishing) step. A second conductive layer 521 and the seed layer 291 are then formed over the conductive rails 542 as shown in FIG. 6b.

A plurality of second rails 712 extending in a second direction along Line 2, as shown in FIG. 1b, can then be formed by patterning the optional hard mask layer 251, the sacrificial layer 231, the seed layer 291, the first conductive layer 521 and rails 102 and 612 in the first device level. As shown in FIG. 1b, the plurality of second rails 712 extend at least partially into the first device level and are separated from each other by rail shaped openings 822 which extend at least partially into the first device level. Thus, the etching extends through first and second levels to form rails in both levels. Each rail 712 comprises rail shaped portions 522, 292, 232, 252 of layers 521, 291, 231 and 251, as shown in FIGS. 1b and 6c. FIG. 6c is a side cross sectional view along line A-A in FIG. 6b.

Turning to FIGS. 1c and 6d, second insulating features 622 can then be formed between the plurality of second rails 712 in the openings 822.

The optional hard mask layer 251 and sacrificial layer 231 can then be removed, as shown in FIG. 6e to expose the seed material rails 292. A plurality of rail shaped openings 832 are located between the second insulating features 622 as shown in FIG. 6e.

Next, the second semiconductor rails 282 are formed over the seed material rails 292. The second semiconductor rails 282 extend in the second direction between the second insulating features 622 and are located in the second device level over the first device level. In some embodiments, the seed material rails 292 and the second semiconductor rails 282 form second diode rails 212.

The step of selectively growing second semiconductor rails 282 may comprise selectively depositing the semiconductor rails 282 to partially fill the openings 832 between the second insulating features 622 to leave recesses 82 over the semiconductor rails 282, as shown in FIGS. 1d and 6f. Alternatively, the step of selectively growing second semiconductor rails 282 may completely fill the openings first, followed by a step of recessing the second semiconductor rails 282 to form recesses 82, such as by selective etching of rails 282.

In an alternative embodiment, the semiconductor rails 282 can be formed by non-selective deposition. In this method, the semiconductor material fills the openings and is located over the tops of the second insulating features 622. The semiconductor material may then be planarized by an etchback or CMP such that it is level with tops of features 622. The semiconductor rails 282 (which can also be referred to as second diode rails 212 if seed rails 292 are omitted) can then be recessed to form rail shaped openings 82, as shown in FIGS. 1d and 6f. In this embodiment, the seed layer 291 may be omitted where the second semiconductor rails 282 encompass the entire structure of rail shaped diodes (i.e., the second diode rails 212).

Figure 1E:
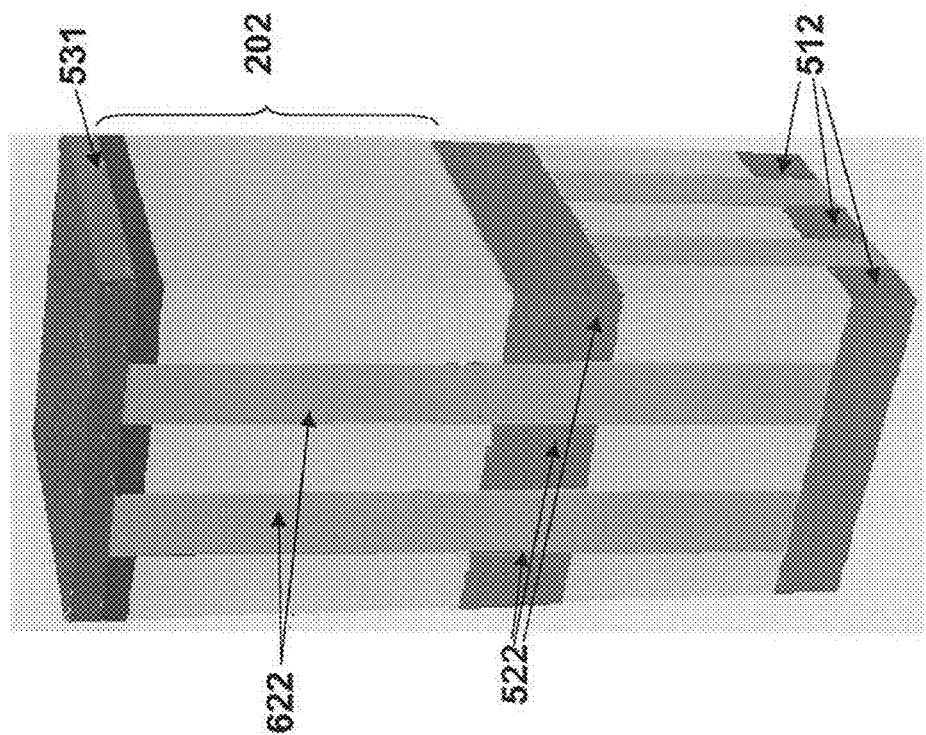
Figure 1F:
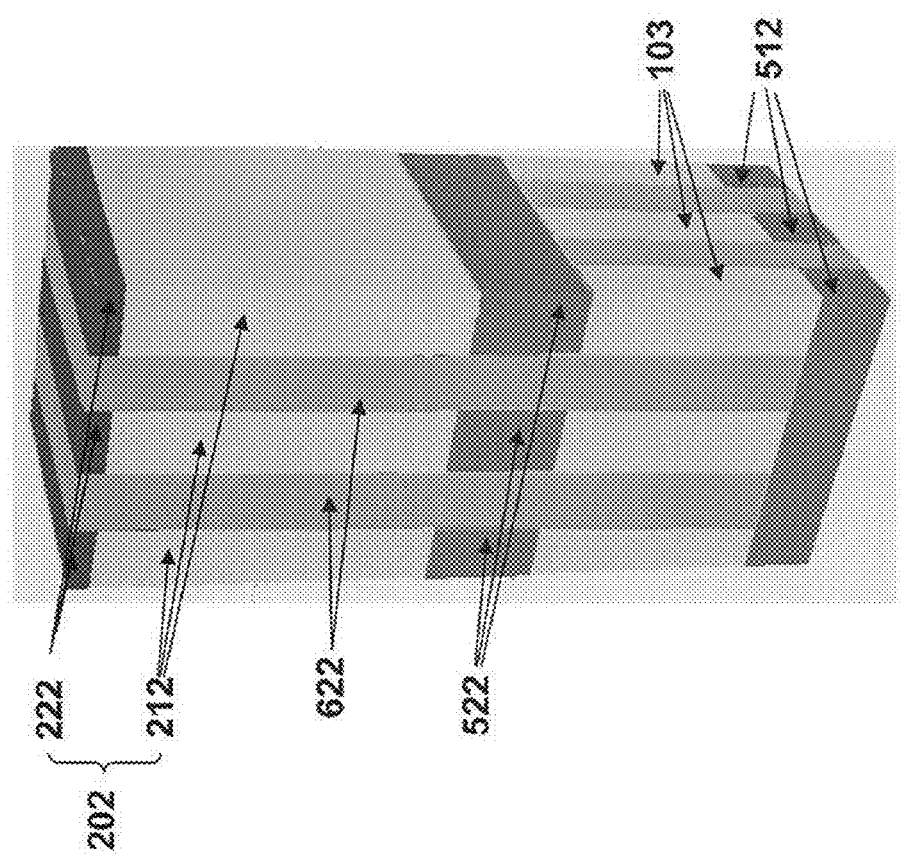

Next, the switching material 222 can then be formed in the rail shaped openings or recesses 82 over the diode rails 212, resulting in a structure shown in FIG. 1e. Material 222 may be optionally planarized with tops of features 622. In some embodiments, the switching material rails 222 and the second diode rails 212 form second non-volatile memory rails 202. Further, a third conductive layer 531 can be formed over the second non-volatile memory rails 202 and the second insulating features or rails 622, as shown in FIG. 1f.

In an alternative embodiment shown in FIGS. 6g, 6h, 6i and 6j, a switching material layer 221 is formed in the recesses 82 and over the tops of the insulating features 622. This is followed by deposition of a conductive layer 551 over the switching material layer. The conductive layer 551 and the switching material layer 221 are then planarized by CMP or other suitable methods using the tops of features 622 as a polish stop. This forms switching material rails 222 and conductive rails 552 in the recesses 82 between insulating features 622. The third conductive layer 531 is then formed over the rails 222 and 552 as shown in FIG. 6j. Thus, the structure shown in FIG. 6j is similar to that shown in FIG. 1f, except for the presence of the additional conductive rails 552 in the structure of FIG. 6j. The method of the alternative embodiment then proceeds the same as described below for the embodiments of FIG. 1g, 2 or 7a-7d.

Turning to FIG. 1g, the second non-volatile memory rails 202, the second insulating features 622 located between the second non-volatile memory rails 202 and the third conductive layer 531 can then be patterned to form a plurality of third rails extending in the first direction separated from each other by rail shaped openings. This is followed by forming third insulating features 632 between the plurality of third rails to form second pillar-shaped non-volatile memory cells 203 separated by insulating material of the second 622 and third 632 insulating features. Remaining rail shaped portions of layer 531 separated by features 632 form upper rail shaped electrodes. Alternatively, the third rail patterning the second memory cells 203 may be completed after depositing several layers of the third device level as will be described below with respect to the alternative method of FIGS. 7a-7d for a three or more level device.

In the above explained embodiments, each of the second pillar-shaped non-volatile memory cells 203 comprises a diode 213 and a switching material 223 located above the diode. The pillar shaped cells 203 have a square or rectangular cross section.

Figure 2:
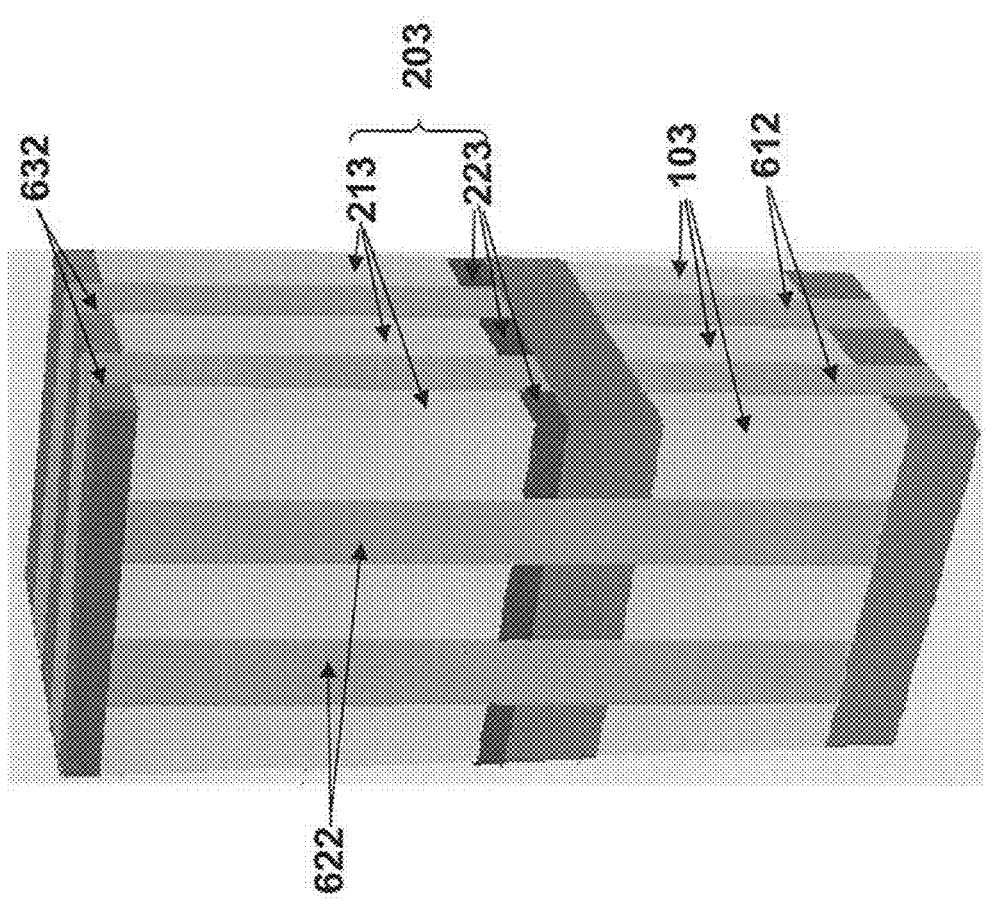
FIG. 2 is a 3D schematic drawing illustrating the structure of a device formed according to an alternative embodiment.

In some alternative embodiments, the switching material 223 may be located below the diode 213. In these alternative embodiments, the switching material may be formed between the second conductive layer 522 and the optional seed layer 291. The second diode rails may be either selectively or non-selectively deposited in the openings formed by removing the sacrificial features to form the second non-volatile memory rails comprising switching material rails located below the second diode rails. After patterning the second non-volatile memory rails and the second insulating features located between the second non-volatile memory rails to form a plurality of third rails and forming the third insulating features 632 between the plurality of third rails, the resulting structure shown in FIG. 2 is formed. Thus, as shown in FIGS. 1g and 2, pillar shaped non-volatile memory cells 103, 203 are formed in the first and second device levels, respectively. Conductive rails 512, 522 act as bottom and top electrodes of cells 103, while rails 522, 532 act as bottom and top electrodes of cells 203.

The first device level (e.g., the lower portion of the structure shown in FIG. 1a) may be formed by any suitable methods. For example, the first device level may be formed by forming a stack of device layers, patterning the stack of device layers to form rails, and forming insulating features between the rails. Alternatively, the first device level may also be formed by damascene methods similar to those described above. A non-limiting example is illustrated in FIGS. 3a through 3f, which are side cross-sectional view illustrating stages in formation of the first device level.

Figure 3B:
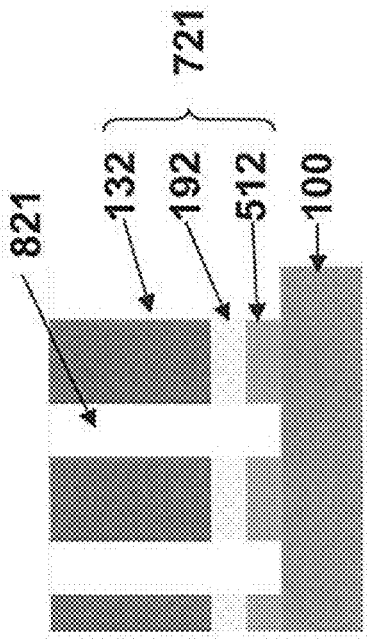
FIGS. 3a to 3f are side cross-sectional views illustrating stages in formation of a first device level according to one embodiment.
Figure 3D:
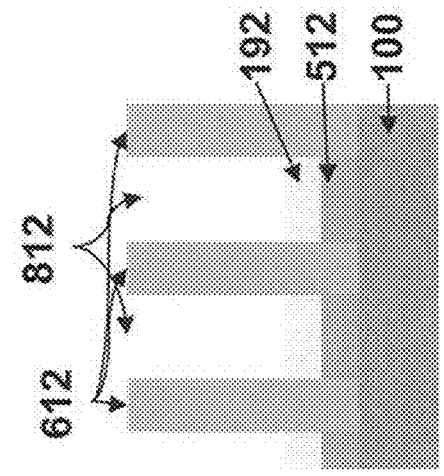
Figure 3A:
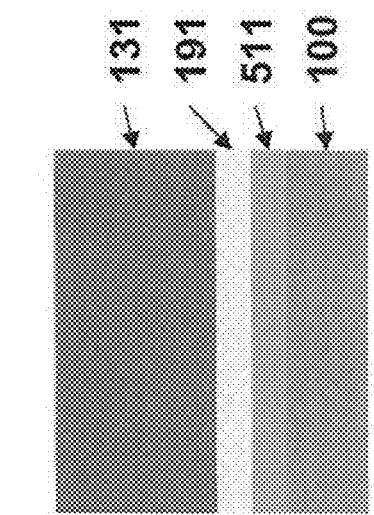

Referring to FIG. 3a, a first conductive layer 511 can be formed over a substrate 100, followed by forming a seed layer 191 over the first conductive layer 511 and a sacrificial layer 131 over the seed layer 191.

Figure 3C:
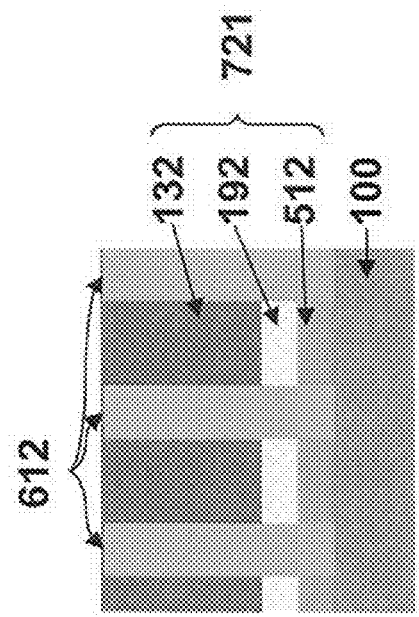

Next, a plurality of sacrificial material rails 132, seed material rails 192, and first conductive rails 512 can be formed by etching the stack of the layers 511, 191, 131, resulting in rails 721 separated by rail shaped openings 842 in FIG. 3b. The etching may be performed using rail shaped photoresist mask (not shown). First rail shaped insulating features 612 can be formed between the plurality of rails 721 (which include sacrificial material rails 132), in openings 842 as shown in FIG. 3c.

The sacrificial material rails 132 can then be removed such as by ashing or selective etching, forming openings 812 over the seed material rails 192, as shown in FIG. 3d. The first semiconductor rails 182 can be then selectively deposited over the seed material rails 192 between the first insulating features 612. In some embodiments, the first semiconductor rails 182 and the seed material rails 192 form the first diode rails 112. Furthermore, the first semiconductor rails 182 can then be recessed by selective etching to form rail shaped openings 81 over the first diode rails 112, resulting in a structure shown in FIG. 3e. Alternatively, the step of selectively depositing the first semiconductor rails 182 may partially fill the openings 812 to form recesses (i.e., rail shaped openings 81) over the first semiconductor rails 182 in one deposition step.

In another embodiment, the first semiconductor rails 182 may be formed by non-selective deposition methods. In this embodiment, the seed material layer 191 may be omitted, and the first semiconductor rails 182 encompass the entire structure of rail shaped diodes (i.e., the first diode rails 112).

Figure 3F:
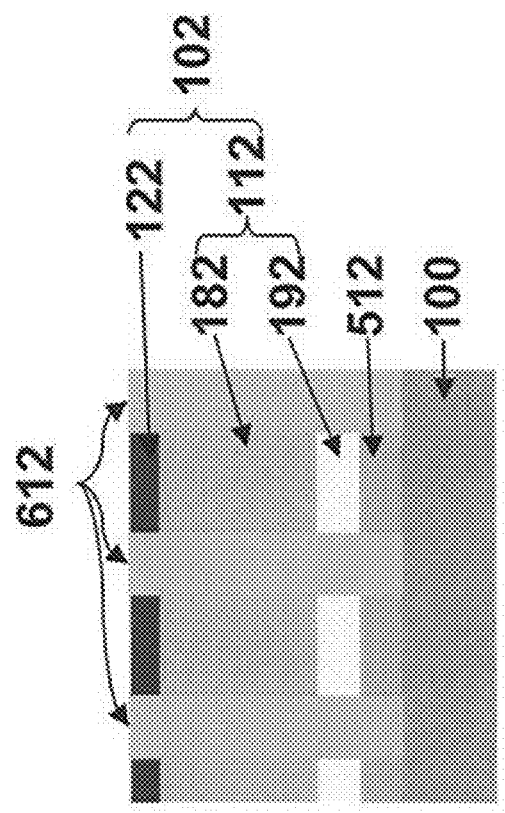
Figure 3E:
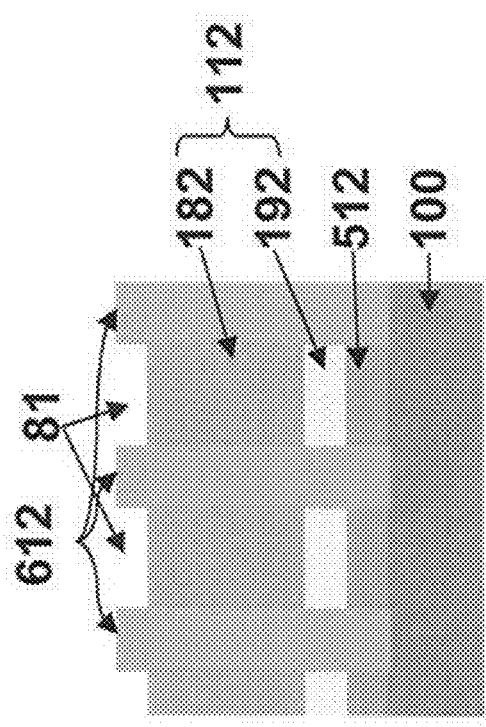

Turning to FIG. 3f, switching material rails 122 can then be formed over the first diode rails 112 in the recesses 81, resulting in a structure shown in FIG. 3f. Rails 122 may be planarized with tops of features 612. The switching material rails 122 and the first diode rails 112 form structures of non-volatile memory rails 102.

In an alternative method shown in FIG. 6a, additional conductive rails 542 may be formed over switching material rails 122. The additional conductive rails 542 and the switching material rails 122 may be formed by forming a conductive layer over a switching material layer in the recesses followed by planarizing both layers in one step by CMP or another method using features 612 as a planarization or polish stop, similar to that shown in FIGS. 6g-6j for the second level.

In the above explained embodiments, the switching material rails 122 are located above the first diode rails 112. Alternatively, the switching material rails 122 may be formed below the first diode rails 112. In these alternative embodiments, as shown in FIG. 4a, a switching material layer 121 may be formed between the first conductive layer 511 and the optional seed layer 191 or sacrificial layer 131 if layer 191 is omitted. After the sacrificial layer 131 and optional layer 191 patterning similar to that shown in FIG. 3b, insulating feature 612 formation similar to that shown in FIG. 3c, and sacrificial feature 131 removal similar to that shown in FIG. 3d, the first diode rails 212 may be either selectively or non-selectively deposited in the openings formed by removing the sacrificial features. The resulting first non-volatile memory rails 102 comprise switching material rails 122 located below the first diode rails 112, as shown in FIG. 4b.

Figure 5B:
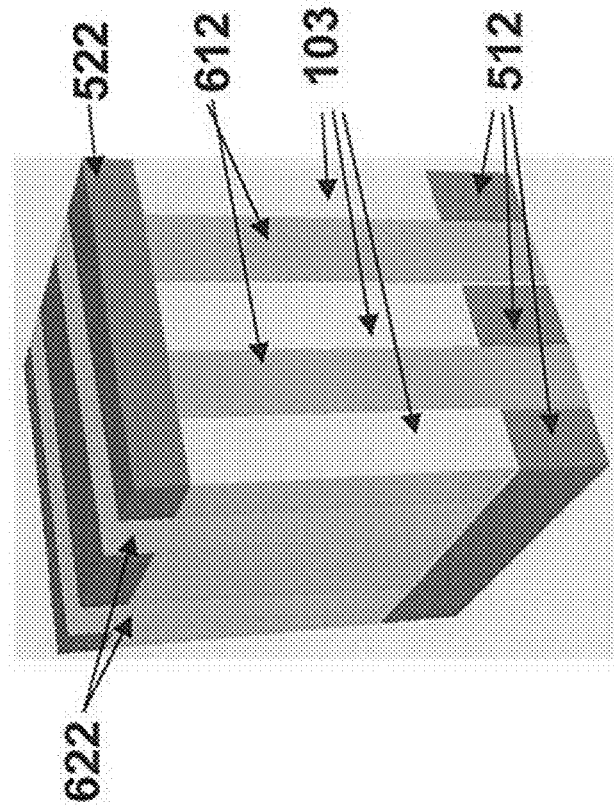
FIG. 5b is a 3D schematic drawing illustrating a structure of a device formed according to an alternative embodiment.
Figure 5A:
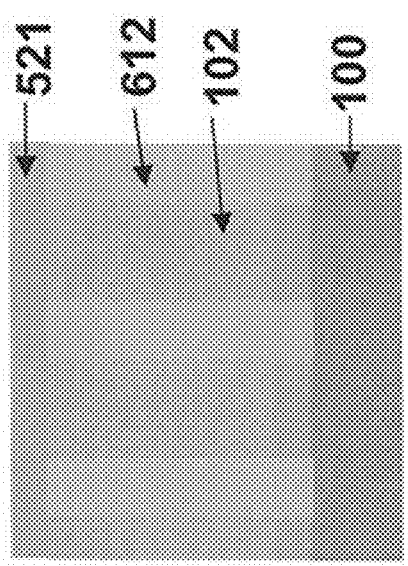
FIG. 5a is a side cross-sectional view illustrating a stage in formation of a device.

Next, as described above, the second conductive layer 521 can then be formed over the first device level, resulting in a structure shown in FIGS. 5a and 6b. The second conductive layer 521 is then deposited over the rails 122 and over optional rails 542 if they are present. This structure corresponds to the lower portion of the 3D structure shown in FIG. 1a. Then, as shown in FIGS. 1b-1g and 2, the first non-volatile memory rails 102 are patterned to form a plurality of first non-volatile memory cells 103 in the first device level. Each cell 103 includes a pillar shaped diode steering element and a pillar shaped storage element above or below the diode.

In an alternative embodiment, rather than using the steps explained in the first embodiment illustrated in FIGS. 1a-1g, the first non-volatile memory rails 102, the first insulating features 612 and conductive layer 521 may be patterned to form a plurality of second rails, between which second insulating features 622 are formed, resulting in a structure shown in FIG. 5b. Each of the resulting pillar shaped first non-volatile memory cells 103 comprises a diode steering element and a storage element of the switching material located above or below the diode steering element. The first non-volatile memory cells 103 are separated by insulating material of the first 612 and 622 insulating rails. The second conductive rails 522 extend in the second direction different from that of the first conductive rails 512. Rails 512 and 522 form the lower and upper electrodes, respectively, of each cell 103.

Thus, as shown in the alternative method of FIG. 5b, the step of forming rails in two device levels using the same etching step shown in FIG. 1b is omitted. Instead, the pillar shaped devices are formed by etching only the layers or rails in the first device level.

Instead of forming insulating features 632 exclusively in the second device level to form pillars 213 in the second device level, as shown in FIGS. 1g and 2, in another alternative method shown in FIGS. 7a-7d, the pillars 213 in the second device level can be formed at the same time as the rails in the third device level.

The method of FIGS. 7a-7d begins after forming the completed first device level and partially completing the second device level using the method shown in FIGS. 6a-6j. FIG. 7a is a cross sectional view of the device of FIG. 6j along line B-B with additional third level layers thereon. In FIG. 7a, the first device level contains electrode rails 512 and 522 (which extend in perpendicular directions) and pillars 103 containing semiconductor diode portions 113, switching material portions 123 and conductive portions 543. The partially completed second device level contains the second seed rails 292, the second semiconductor rails 282, the second switching material rails 222 and third conductive layer 531. Then, the following third device level layers are deposited over the partially completed second device level: a third seed layer 391, a third sacrificial material layer 331 and an optional third hard mask layer 351. Note that the third level initially lacks the semiconductor and switching material layers.

Then, as shown in FIG. 7b, the rail shaped trenches 842 are formed through the second and third device levels down to rails 522 to form rails 722. The rails 722 are composed of semiconductor pillars 213, switching material pillars 223 and optional conductive pillars 553 which are separated by insulating features 622 (shown in FIG. 6j and which are located in and out of the page in the view of FIG. 7a), third conductive rails 532, third seed rails 392, third sacrificial material rails 332, and third hard mask rails 352.

The trenches 842 are filled with third insulating features 642 which are planarized by CMP or other suitable methods, as shown in FIG. 7c.

Finally, as shown in FIG. 7d, the third sacrificial material rails 332 and the third hard mask rails 352 are selectively etched. Then, the third semiconductor rails 382, third switching material rails 322 and third conductive rails 562 are formed in place of the third sacrificial and hard mask rails using a method similar to that shown in FIGS. 6e-6j. Additional levels may be then be formed using similar techniques as those described above. For example, the device may comprise 4-8 levels, where the rail shaped electrodes in each level extend in the same direction and the electrodes in adjacent levels extend in perpendicular directions. In other words, the electrodes in all even numbered levels preferably extend in one first direction, while the electrodes all odd numbered levels extend in a perpendicular second direction. Each device level includes pillar shaped memory cells between lower and upper electrodes.

In some other embodiments, the switching material 122 and/or 222 may be omitted. In these embodiments, the pillar shaped devices 103, 203 are diodes, which may or may not function as both storage and steering elements of a non-volatile memory cell as described in US Published Application 2007/0072360 A1, incorporated by reference herein in its entirety.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as glass, plastic, metal or ceramic substrate. The substrate may include integrated circuits fabricated thereon, such as driver circuits for a memory device.

The conductive material of the conductive rails 512, 522 and 532 can independently comprise any one or more suitable conducting material known in the art, such as tungsten, copper, aluminum, tantalum, titanium, cobalt, titanium nitride or alloys thereof. For example, in some embodiments, tungsten is preferred to allow processing under a relatively high temperature. In some other embodiments, copper or aluminum is a preferred material.

The insulating material of the features 612, 622 and 632 can be any electrically insulating material, such as silicon oxide, silicon nitride, silicon oxynitride, or other high-k insulating materials. The sacrificial materials 131 and 231 may comprise any suitable sacrificial materials, including organic hard mask material such as amorphous carbon or silicon nitride material. For example, the sacrificial material may be amorphous carbon and the hard mask material may be silicon nitride. The sacrificial material should have etching characteristics different from that of the insulating features 612 and/or 622 to allow selective etching or ashing.

Any suitable semiconductor materials can be used for features 113 and 213, for example silicon, germanium, silicon germanium, or other compound semiconductor materials, such as III-V, II-VI, etc. materials. As explained above, the semiconductor material may be formed by any suitable selectively or non-selectively deposition methods. In one embodiment, the semiconductor material in at least one of the first and second device levels is selectively deposited by low pressure chemical vapor deposition (LPCVD). For example, the method described in U.S. application Ser. No. 12/216,924 filed on Jul. 11, 2008 or U.S. application Ser. No. 12/007,781 (published as US Published Application 2009/0179310 A1), incorporated herein by reference in their entirety, may be used to deposit polysilicon. Alternatively, the methods described in U.S. application Ser. No. 11/159,031 filed on Jun. 22, 2005 (which published as US Published Application 2006/0292301 A 1) and in U.S. application Ser. No. 12/007,780 filed on Jan. 15, 2008, incorporated herein by reference in their entirety, may be used to deposit the germanium. The semiconductor material may be amorphous, polycrystalline or single crystal. For example, the material may comprise polysilicon. The optional seed layer material may comprise any suitable semiconductor or silicide seed material which allows selective growth of the semiconductor materials of the features 113 and 213. For example, the seed layer may comprise polysilicon to grow additional polysilicon of the features 113 and 213.

The non-volatile memory cells 103 and 203 may be one-time programmable (OTP) or re-writable. For example, each pillar diode 113 may act as a steering element of a memory cell, while a switching material 123 may act as a storage element (i.e., which stores the data by changing its resistivity state, etc.) provided in series with the steering element. The diodes may have a bottom heavily doped n-type region, an optional intrinsic region (a region which is not intentionally doped), and a top heavily doped p-type region. The orientation of the diodes may be reversed. The diodes may be formed by depositing intrinsic semiconductor material on the n-type or p-type material followed by implanting the other one of the n-type or p-type dopants into the upper portion of the diodes. Alternatively, the upper regions of the p-i-n diodes may be formed by depositing a doped semiconductor material on the intrinsic semiconductor material.

The switching material can be one of antifuse, fuse, metal oxide memory, switchable complex metal oxide, carbon nanotube memory, graphene resistivity switchable material, carbon resistivity switchable material, phase change material memory, conductive bridge element, or switchable polymer memory. The antifuse dielectric layer can be one of hafnium oxide, aluminum oxide, titanium oxide, lanthanum oxide, tantalum oxide, ruthenium oxide, zirconium silicon oxide, aluminum silicon oxide, hafnium silicon oxide, hafnium aluminum oxide, hafnium silicon oxynitride, zirconium silicon aluminum oxide, hafnium aluminum silicon oxide, hafnium aluminum silicon oxynitride, zirconium silicon aluminum oxynitride, silicon oxide, silicon nitride, or a combination thereof.

The methods of forming one or two device levels have been explained above. Additional memory levels can be formed above or below the first or the second memory levels described above to form a monolithic three dimensional memory array having more than two device levels. For example, the third level may be formed over the second level and oriented in the same direction as the first level and the rails in the second and third levels may be etched during the same etching step.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits and fabrication steps are not specifically described, such circuits and protocols are well known, and no particular advantage is afforded by specific variations of such steps in the context of practicing this invention. Moreover, it is believed that one of ordinary skill in the art, equipped with the teaching of this disclosure, will be able to carry out the invention without undue experimentation.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A method of making a device, comprising:
    providing a first device level comprising first semiconductor rails separated by first insulating features, the first semiconductor rails extending in a first direction;
    forming a sacrificial layer over the first device level;
    patterning the sacrificial layer and the first semiconductor rails in the first device level to form a plurality of second rails extending in a second direction, wherein the plurality of second rails extend at least partially into the first device level and are separated from each other by rail shaped openings which extend at least partially into the first device level;
    forming second insulating features between the plurality of second rails;
    removing the sacrificial layer;
    forming second semiconductor rails extending in the second direction between the second insulating features in a second device level over the first device level;
    patterning the second semiconductor rails and the second insulating features located between the second semiconductor rails to form a plurality of third rails extending in the first direction;
    forming third insulating features between the plurality of third rails to form second pillar-shaped non-volatile memory cells separated by insulating material of the second and third insulating features, wherein each of the second pillar-shaped nonvolatile memory cells comprises a diode and a switching material located above or below the diode;
    recessing the second semiconductor rails to form rail shaped openings after forming the second semiconductor rails between the second insulating features; and
    forming the switching material in the rail shaped openings over the second semiconductor rails.

2. The method of claim 1, wherein the step of forming second insulating features between the plurality of second rails forms first pillar-shaped non-volatile memory cells separated by insulating material of the first and second insulating features in the first device level.

3. The method of claim 2, wherein the first device level further comprises a first switching material located above or below the first semiconductor rails.

4. The method of claim 1, wherein the first device level comprises first conductive rails extending in the first direction located below the first semiconductor rails, and second conductive rails extending in the second direction located above the first semiconductor rails.

5. The method of claim 4, further comprising forming third conductive rails extending in the first direction over the second pillar-shaped non-volatile memory cells.

6. A method of making a device, comprising:
    providing a first device level comprising first semiconductor rails separated by first insulating features, the first semiconductor rails extending in a first direction;
    forming a sacrificial layer over the first device level;
    patterning the sacrificial layer and the first semiconductor rails in the first device level to form a plurality of second rails extending in a second direction, wherein the plurality of second rails extend at least partially into the first device level and are separated from each other by rail shaped openings which extend at least partially into the first device level;
    forming second insulating features between the plurality of second rails;
    removing the sacrificial layer;
    forming second semiconductor rails extending in the second direction between the second insulating features in a second device level over the first device level;
    patterning the second semiconductor rails and the second insulating features located between the second semiconductor rails to form a plurality of third rails extending in the first direction; and
    forming third insulating features between the plurality of third rails to form second pillar-shaped non-volatile memory cells separated by insulating material of the second and third insulating features;
    wherein each of the second pillar-shaped nonvolatile memory cells comprises a diode and a switching material located above or below the diode; and
    wherein the step of forming the second semiconductor rails comprises selectively depositing the second semiconductor rails between the second insulating features on a semiconductor seed layer over the first device level below a height of the second insulating features to form rail shaped openings over the second semiconductor rails.

7. The method of claim 6, further comprising forming the switching material in the rail shaped openings over the second semiconductor rails.

8. The method of claim 1, wherein the sacrificial layer comprises organic hard mask material or nitride material.

9. The method of claim 6, wherein the step of forming second insulating features between the plurality of second rails forms first pillar-shaped non-volatile memory cells separated by insulating material of the first and second insulating features in the first device level.

10. The method of claim 6, wherein the first device level further comprises a first switching material located above or below the first semiconductor rails.

11. The method of claim 6, wherein the first device level comprises first conductive rails extending in the first direction located below the first semiconductor rails, and second conductive rails extending in the second direction located above the first semiconductor rails.

12. The method of claim 6, further comprising forming third conductive rails extending in the first direction over the second pillar-shaped non-volatile memory cells.

13. The method of claim 6, wherein the sacrificial layer comprises organic hard mask material or nitride material.

* * * * *